(12) United States Patent
Einspenner et al.

(10) Patent No.: US 7,370,303 B2
(45) Date of Patent: May 6, 2008

(54) METHOD FOR DETERMINING THE ARRANGEMENT OF CONTACT AREAS ON THE ACTIVE TOP SIDE OF A SEMICONDUCTOR CHIP

(75) Inventors: Juergen Einspenner, Munich (DE); Dagmar Gliese, Munich (DE); Herbert-Arndt Ziebell, Alteglofsheim (DE)

(73) Assignee: Infineon Technologies AG, Munich (DE)

( * ) Notice: Subject to any disclaimer, the term of this patent is extended or adjusted under 35 U.S.C. 154(b) by 46 days.

(21) Appl. No.: 10/528,035

(22) PCT Filed: Sep. 26, 2003

(86) PCT No.: PCT/DE03/03208

§ 371 (c)(1),
(2), (4) Date: Dec. 16, 2005

(87) PCT Pub. No.: WO2004/031996

PCT Pub. Date: Apr. 15, 2004

(65) Prior Publication Data

US 2006/0138634 A1    Jun. 29, 2006

(30) Foreign Application Priority Data

Sep. 27, 2002    (DE) ................. 102 45 452

(51) Int. Cl.
  *G06F 17/50*    (2006.01)
  *G06F 9/45*    (2006.01)
(52) U.S. Cl. ................... 716/8; 716/1; 716/10; 438/98; 438/106
(58) Field of Classification Search ............. 716/4–12, 716/1, 2; 438/98, 100, 106–108
See application file for complete search history.

(56) References Cited

U.S. PATENT DOCUMENTS

| 5,331,572 A | 7/1994 | Takahashi |
| 5,498,767 A | 3/1996 | Huddleston et al. |
| 5,608,638 A | 3/1997 | Tain et al. |
| 5,627,408 A | 5/1997 | Kusumi |

(Continued)

FOREIGN PATENT DOCUMENTS

| JP | 59-139660 | 8/1984 |
| JP | 2004-085947 | 3/2004 |

OTHER PUBLICATIONS

Ho Chew Choy Paul, SG, "Pad Placement Algorithm for Four-sided Packages", Siemens Technik Report, JG 4 Nr. 10, Jan. 2001, pp. 142-150.

*Primary Examiner*—Jack Chiang
*Assistant Examiner*—Nghia M. Doan
(74) *Attorney, Agent, or Firm*—Dicke, Billig, Czaja PLLC

(57) ABSTRACT

In the case of a method according to the invention for determining the arrangement of contact areas on the active top side of a semiconductor chip arranged in or on a housing, firstly semiconductor chip data, contact area data, housing data and production data are read in, from which a model of an electronic device is then determined. This is followed by determining the arrangement of the contact areas in said model of the electronic device. The contact area arrangement data thus determined are provided for subsequent fabrication and/or design processes.

5 Claims, 10 Drawing Sheets

U.S. PATENT DOCUMENTS

| | | |
|---|---|---|
| 5,828,116 A | 10/1998 | Ao |
| 5,930,599 A * | 7/1999 | Fujimoto et al. ........... 438/113 |
| 6,133,623 A | 10/2000 | Otsuki et al. |
| 6,357,036 B1 | 3/2002 | Eka et al. |
| 6,405,357 B1 | 6/2002 | Chao et al. |
| 6,727,579 B1 * | 4/2004 | Eldridge et al. ............ 257/692 |
| 6,773,960 B2 * | 8/2004 | Fee et al. ................... 438/110 |

* cited by examiner

METHOD FOR DETERMINING THE ARRANGEMENT OF CONTACT AREAS ON THE ACTIVE TOP SIDE OF A SEMICONDUCTOR CHIP

FIELD OF THE INVENTION

The invention relates to a method for determining the arrangement of contact areas on the active top side of a semiconductor chip.

BACKGROUND

The present invention considers electronic devices having semiconductor chips which are arranged in or on housings. Such a housing may be an arbitrary housing made of plastic, a printed circuit board or a leadframe or flat conductor frame. During the fabrication of such an electronic device, the semiconductor chip is electrically connected to the housing by means of bonding wires. Said bonding wires extend from contact areas or chip pads arranged on the active top side of the semiconductor chips to the contact pads situated on the top side of the housing, preferably at at least one inner edge facing the semiconductor chip.

The actual production of such often very complex electronic devices is preceded by a design process that defines the precise geometrical and electrical specifications of the electronic device with a semiconductor chip and with a housing as a basis for the production process.

The design processes that have been customary hitherto, in particular for semiconductor chips of this type, in practice often yield erroneous designs which can only be identified in a downstream simulation step and sometimes even remain undiscovered. Eliminating such problems causes an enormous delay in the fabrication of the semiconductor chip and is associated with great costs.

SUMMARY

The invention provides a method which yields an error-free design of the electronic device, of the semiconductor chip and of the housing, which design can serve as a basis for the subsequent production process. In particular, the intention is for an error-free bonding plan to be created by the design method.

Embodiments of the invention provide a method which enables the development of semiconductor chips and of housings to be better coordinated with one another.

An electronic device according to one embodiment of the invention comprises a housing and also a semiconductor chip arranged with its passive rear side on the top side of the housing or in an area within the housing. Situated within the housing are contact pads arranged next to the semiconductor chip and/or around the semiconductor chip. If the housing has a recess, then said contact pads are preferably arranged at an inner edge of the top side of the housing which defines the contour of the recess. The semiconductor chip has contact areas on its active top side in edge regions. Said contact areas are in each case situated on straight imaginary connecting lines between the contact pads and the area centroid or the midpoint of the active top side of the semiconductor chip. Bonding wires run between the contact areas and the contact pads. An electronic device of this type may additionally be potted with a casting composition.

Such an arrangement of the contact areas affords the advantage that the production sequences of the bonding machines can be optimized. What is more, the bonding wires have a radial profile and can withstand high loads or high stress.

The invention furthermore relates to a method for determining the arrangement of contact areas on the active top side of a semiconductor chip.

In the case of this method, semiconductor chip data comprising geometrical properties of the semiconductor chip and also information about the number of contact areas to be arranged at the edges of the semiconductor chip are firstly read into the computer system or into a main memory area of the computer system. Said data may be present for example in the form of a network list which specifies the order of the contact areas. Contact area data comprising the geometrical and/or electrical properties of the contact areas to be arranged on the active top side of the semiconductor chip are then read into the computer system. The precise arrangement of said contact areas on the active top side of the semiconductor chip is not yet known at this point in time in the method. These contact area data concern in particular the form or the length and the width of the contact areas and also a minimum distance to be complied with around the contact areas. By way of example, specific minimum distances may be prescribed between signal contact areas and voltage supply contact areas or between analog and digital contact areas. The housing data, which take account of the housing specifics, are subsequently read in. They concern the geometrical and/or the electrical properties of the housing in which the semiconductor chip is to be positioned, the geometrical and/or electrical properties and the exact positioning of those contact pads which are arranged on the top side of the housing and which are to be connected to the contact areas of the semiconductor chip. Said housing data may be present for example in GDSII or "Graphical Data Standard Interface" format and satisfy specific requirements or contain specific predefined objects. Production data, which define inter alia the arrangement of the semiconductor chip in relation to the housing, are then read into the computer system. Said production data emerge from the design rules.

All of the data read into the computer system form the input data for the method according to the invention and are advantageously stored in databases or libraries of the computer system. The method according to the invention has recourse to these input data. The order of the individual read-in steps described above is arbitrary in this case.

On the basis of all the data previously read in, the computer system then generates a model of the electronic device, which represents the housing and the semiconductor chip arranged with its passive rear side on the top side of the housing or in an area within the housing. Said model is present in the form of a graphic backed by geometrical and/or electrical data in particular in binary form. The structure of such a model is known to the person skilled in the art and need not be explained in any greater detail here.

The next method step involves determining the precise arrangement of the contact areas on the active top side of the semiconductor chip in the edge regions thereof. This determination of the arrangement is performed exclusively in the model of the electronic device on the computer system. In this case, the invention comprises the four method variants explained below.

In accordance with a first method variant, the contact areas are arranged such that they lie in each case on straight connecting lines or auxiliary lines between the contact pads on the top side of the housing and the area centroid or midpoint of the active top side of the semiconductor chip.

This results in a radial profile of the bonding wires to be applied. The bonding wires to be applied are particularly optimized in respect of loading and stress in the case of such an arrangement of the contact areas and the contact pads.

In accordance with a second embodiment, the contact areas are arranged in a uniformly distributed manner at each semiconductor chip edge. In this case, the distances between respectively adjacent contact areas are formed with the same magnitude. Moreover, it is possible to form the distances between the respective outermost contact areas per semiconductor chip edge and the adjoining semiconductor chip edges with the same magnitude as the distances between the adjacent contact areas of the same chip edge. Such a uniformly distributed arrangement of the contact areas ensures a particularly favorable distribution of the contact areas at each semiconductor chip edge.

In accordance with a further embodiment, the contact areas are firstly in each case arranged on straight connecting lines between the contact pads on the top side of the housing and the area centroid or midpoint of the active top side of the semiconductor chip. Afterward, the contact areas arranged at an identical semiconductor chip edge in each case are displaced in such a way that the distances between adjacent contact areas and/or between the respective outermost contact areas per semiconductor chip edge and the adjoining semiconductor chip edges are formed with the same magnitude in each case. In the case of this embodiment, in an advantageous manner, firstly all the contact areas are arranged at that semiconductor chip edge through which runs the connecting line between the associated contact pad and the area centroid or the midpoint of the active top side of the semiconductor chip. A disadvantageous arrangement of contact areas on a semiconductor chip edge that is further away from the contact pad is thus reliably avoided. Only afterward are the contact pads uniformly distributed on the respective semiconductor chip edge, thereby ensuring a favorable distribution of the contact areas on the semiconductor chip edges.

In accordance with another embodiment, the contact areas are arranged such that the distances between the contact areas and contact pads that are to be electrically connected to one another in each case are minimized. This method variant ensures a bonding connection between contact areas and contact pads which is particularly optimal in respect of wire length and is formed in a particularly reliable and durable manner.

The method according to the invention thus yields a proposal for a contact area arrangement on the active top side of the semiconductor chip. The arrangement thus determined is stored in a memory area of the computer system in the form of geometrical data referred to a zero point. It is also possible for the arrangement data determined in this way to be made available directly to the fabrication process of the semiconductor chip and/or of the housing and/or of the electronic device. These arrangement data may also be utilized for subsequent design processes of the semiconductor chip and/or of the housing and/or of the electronic device. In this case, interfaces to other computer-implemented methods may be provided, for example to so-called "floor planners" and "design tools".

In accordance with a basic concept of the invention, in contrast to customary methods the positioning of the contact areas on the semiconductor chip is no longer determined by using manually designed connection lists, the creation of which incorporates the designers' experience, but rather by means of a computer system which accesses existing databases and uses algorithms. Consequently, the method according to the invention is not based on rough estimations, but rather automatically takes account of technology-dictated parameters which emerge e.g. from contact area libraries and which have an influence on the contact area arrangement on the active top side of the semiconductor chips and also on the number of contact areas provided for current or voltage supply.

In accordance with a second basic concept of the invention, the user can select from among a plurality of reliable criteria for optimized arrangement of the contact areas. An erroneous or only suboptimal arrangement of the contact areas on the semiconductor chip is thus reliably avoided. Particularly in the case of semiconductor chips having a multiplicity of contact areas, so-called "high pin count devices", the method according to the invention results in a significant reduction of the susceptibility to errors or the error rate.

In accordance with a further basic concept of the invention, the dependence of the arrangement of the contact areas on the semiconductor chip on the geometrical and electrical properties of the housing is already taken into account during the design process. This ensures that the designed semiconductor chip can also actually be positioned in the planned housing and the electronic device can also actually be fabricated. This is particularly important since, in practice, the semiconductor chips and the housings are often developed separately from one another and many sources of error result from this.

The number of manual work steps that are particularly susceptible to errors is significantly reduced in the case of the method according to the invention. Moreover, the design process or the "design flow", of electronic devices according to the invention is standardized by the use of the method according to the invention for determining the arrangement of contact areas.

What is more, the contact area arrangement data generated by the method according to the invention can be made available in a standard output format, for example "DEF". This format can advantageously be read by a multiplicity of computer-implemented continuing design methods, in particular "floor planning tools", and serves as a standard interface. As a result, all of the contact area arrangement data generated can be subjected directly to further processing by continuing computer-implemented design methods. The method according to the invention can accordingly be used diversely and in a user-friendly manner. Moreover, the method according to the invention can also access output data of those computer-implemented design methods which use this type of standard interface.

The invention furthermore provides a method for creating a bonding plan for an electronic device having a semiconductor chip and having a housing. This method builds on the above-described method for arranging contact areas and is likewise performed on a computer system.

At the beginning of the method for creating a bonding plan, the arrangement of contact areas on the active top side of the semiconductor chip is determined by performing the method described above. This is followed by defining the arrangement of integrated circuits, in particular of memory elements, of memory interfaces, of processors or CPUs and of analog modules on the active top side of the semiconductor chip. The final size and embodiment of the individual integrated circuits to be arranged on the semiconductor chip are not yet known in this case. All that is established in the case of this method step is which integrated circuits are intended to be positioned on the semiconductor chip. This emerges from the semiconductor chip data read in at the beginning. In this case, the arrangement of the integrated circuits is effected on the basis of their estimated dimensions using arrangement methods known to the person skilled in the art. Moreover, the arrangement of filler structures on the active top side of the semiconductor chip is determined, said filler structures being formed as metal areas on the semiconductor chip. These filler structures are provided for electrical connection or for voltage supply of the contact areas and are situated at the edges of the semiconductor chip in each case between the contact areas. These filler structures, also referred to as filler cells, have already been defined beforehand in terms of their size and emerge from the production data read in at the beginning of the method. The planning of the arrangement of the integrated circuits and of the filler structures is also referred to as "floor planning". The arrangement of the integrated circuits depends on the arrangement of the contact areas on the semiconductor chip. It is possible, therefore, for the arrangement of the contact areas on the edge regions of the semiconductor chip to be changed in this method step.

Next, the method involves determining a model or a physical layout of the active top side of the semiconductor chip at the gate level. In this case, the semiconductor components of the integrated circuits determined previously are designed, positioned and wired in the model at the gate level. The semiconductor components are subdivided into active components, e.g. transistors, diodes, thyristors and triacs, and into passive components, e.g. resistances, inductances, capacitances and filters. The model at the gate level determined in this way also comprises the contact areas of the semiconductor chip and has a plurality of levels or material layers arranged above one another and next to one another. It is present in binary form and can be converted into a text format.

The subsequent method step provides for checking the electrical and the logical behavior of the semiconductor chip using customary computer-implemented simulation and verification methods that are known to the person skilled in the art, for example by means of analog simulators or delay time calculations or "delay calculations". In the case of these simulation and verification methods, electrical signals are sent through the semiconductor chip and the measured output variables are compared with expected ones. Errors in the model of the semiconductor chip are reliably detected in this method step. Furthermore, it is possible at this juncture, for example by considering the signal propagation times, to make a statement about whether the semiconductor chip matches the housing considered or whether there are more suitable housings available. If errors are detected in the model at this juncture, the method according to the invention is terminated. If this is not the case, then the method according to the invention continues with extracting the data required for the bonding plan from the model determined previously.

Said extracted data are data regarding the arrangement and regarding the geometrical and electrical properties of the contact areas and the contact pads. Only the relevant levels or material layers of the active top side of the semiconductor chip are considered in this case. In an advantageous manner, the names of the contact areas and of the contact pads are concomitantly extracted in this case. In practice, this extraction is effected by means of computer-implemented manipulation methods which are known to the person skilled in the art and satisfy the "graphical data standard" or "GDS".

Next, housing data that have been created by a parallel housing design process are read in. Such a housing design process, known to the person skilled in the art, is in this case based on housing data comprising the geometrical and/or the electrical properties of the housing and also the geometrical and/or electrical properties and the exact positioning of the contact pads. In this case, the housing design process provides housing design, simulation, contact artwork creation and storage of the housing data in a standardized graphical format, in particular in GDSII. The housing data that are created and stored in this way are included in the creation of a bonding plan.

Next, the method provides for creating a bonding plan or a bonding diagram on the computer system. Such a bonding plan is an abstract graphical representation of the housing and of the semiconductor chip arranged in or on the housing and also of the bonding connections between the contact areas and the contact pads, this graphical representation being backed by the geometrical and relevant electrical data referred to a fixed zero point. The previously extracted data and also the housing data read in previously are used for creating said bonding plan.

The bonding plan created in this way is checked and verified for alterations with respect to the model of the electronic device generated at the beginning of the method. This involves checking whether the arrangement of the contact areas in the bonding plan has changed with respect to the arrangement of the contact areas in the model of the electronic device generated at the beginning of the method. In particular, error messages are generated if contact areas have been deleted, added or interchanged in their order. If discrepancies are ascertained, then the bonding plan created can be rejected and, on the basis of the insights drawn from this, the renewed performance of the method according to the invention can be created by means of an improved bonding plan. If no serious discrepancies result at this juncture, then in a concluding method step the bonding plan is provided for the bonding machines or wirebonders, which can process the bonding plan directly. After specific production-dictated process parameters have been set, the bonding machines can directly commence production.

In accordance with a basic concept of this method, the bonding plan is no longer created manually, but rather is created by using semiconductor chip data extracted from the model determined previously, housing data read in, and also contact area arrangement data determined previously. In an advantageous manner, signal and instance names are concomitantly extracted in this case.

A further advantage of the method according to the invention for creating a bonding plan consists in the fact that the bonding plans created have already been subjected to a testing or a verification and accordingly have a very low error rate. Errors present in the design data are reliably discovered.

The invention also relates to a method for generating geometry data for the creation of photomasks for the exposure of an electronic device having a semiconductor chip and having a housing by means of photolithographic methods. In this case, the method for generating geometry data likewise proceeds on a computer system and corresponds in the first four method processes, that is to say up to the method of checking the electrical and the logical behavior of the semiconductor chip, to the method according to the invention for creating a bonding plan which has already been explained. Therefore, these method processes will not be explained again.

In the first method process that differs from the method already described, the geometry data required for the photomasks are determined from the previously determined model of the active top side of the semiconductor chip, with production tolerances being included in the calculation. A plurality or all of the photomasks to be produced form a set of masks in this case. GDS manipulation routings known to the person skilled in the art are used in this case. The set of masks which is imaged on the wafer by means of photolithographic processes can finally be created from these mask data for wafer creation. The data volume of the geometry data required for the photomask is up to a few hundred gigabytes. Accordingly, the representation of said mask data is restricted to pure geometry data. A graphical representation is scarcely possible.

Next, the geometry data generated in this way are checked for alterations with respect to the model of the electronic device generated in the first process of the method according to the invention, in particular for displacements, for deletions, for combinations and for interchangings of the contact areas. If such discrepancies are ascertained, then an error message is output.

The geometry data generated in this way are provided for the subsequent methods for creating the photomasks. In this case, said geometry data may be buffer-stored on a memory area of the computer system or be forwarded directly.

A particular advantage of this method according to the invention for generating geometry data for the creation of photomasks consists in the fact that the geometry data required for the photomasks are generated automatically without an intermediate step that is to be carried out by a user. The geometry data generated in this way are very precise and have few errors.

Moreover, this method, through the use of a standard interface, can be employed in a particularly user-friendly manner and particularly diversely in that the subsequent design programs can directly access the output data generated by the method according to the invention.

The invention also relates to a semiconductor chip and also an electronic device having a housing and having a semiconductor chip arranged in or on the housing, the fabrication of which has in each case involved using the method according to the invention for determining the arrangement of conduct areas and/or the method according to the invention for creating a bonding plan and/or the method according to the invention for generating geometry data for the creation of photomasks. Such a semiconductor chip or such electronic devices have been fabricated effectively and are therefore particularly cost-effective. Moreover, they have a very low error rate.

The invention also relates to a housing, the design of which has involved carrying out the method according to the invention for determining the arrangement of contact areas on the active top side of the semiconductor chip and in the case of which the contact area arrangement data created by this method have been used as a basis for creating the housing.

During the design of such a housing, the method process of simulation, contact artwork creation and storage of the housing data in a standardized graphical format, in particular in "GDSII", are performed according to the housing design. The housing data created and stored in this way are incorporated in the creation of a bonding plan. This ensures that a coordination is effected between the development processes of the semiconductor chip and of the housing. In particular, the interfaces for transferring the data from the computer-implemented method according to the invention for determining the arrangement of contact areas to housing design planning and also between housing design planning and the computer-implemented method according to the invention for creating a bonding plan are standardized. In practice, transferring the contact area arrangement data to housing development involves a conversion into network lists for the housing data required for interaction between the semiconductor chip and the housing. A housing designed according to the invention is accordingly coordinated with the semiconductor chip that is to be arranged in it, as a result of which difficulties or errors in contact-connection can largely be precluded.

The invention is also realized in a computer program for performing the method according to the invention for determining the arrangement of contact areas on the active top side of a semiconductor chip and/or for performing a method for creating a bonding plan for an electronic device having a semiconductor chip and having a housing and/or for performing a method for generating geometry data for the creation of photomasks for the exposure of an electronic device having a semiconductor chip and having a housing by means of photolithographic methods.

In this case, the computer program contains program instructions which cause a computer system to perform such methods in an embodiment described above. The computer program outputs as a result the specific contact area arrangement data, the created bonding plan or the generated geometry data for the subsequent creation of the photomasks on an output unit, in particular on a screen or on a printer. Further design processes can be performed and/or production machines can be operated on the basis of these data.

The computer program according to the invention results in a realistic, precise and low-error design of semiconductor chips, of housings and of electronic devices. Moreover, the use of the computer program according to the invention also makes it possible to design extensive and complex electronic devices which hitherto have not been able to be designed or have been able to be designed only with major losses of quality with the methods that have been used hitherto, which have still necessitated extensive manual work steps.

The invention additionally relates to a computer program which is contained on a storage medium, which is stored in a computer memory, which is contained in a read-only memory or which is transmitted on an electrical carrier signal.

The invention also relates to a carrier medium, in particular a data carrier, such as, for example, a floppy disk, a zip drive, a streamer, a CD or a DVD, on which a computer program described above is stored. Furthermore, the invention relates to a computer system on which such a computer program is stored. Finally, the invention relates to a method in which such a computer program is downloaded from an electronic data network, such as from the Internet, for example, onto a computer connected to the data network.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is illustrated in more detail in the drawings on the basis of an exemplary embodiment.

BRIEF DESCRIPTION

Figure 1:
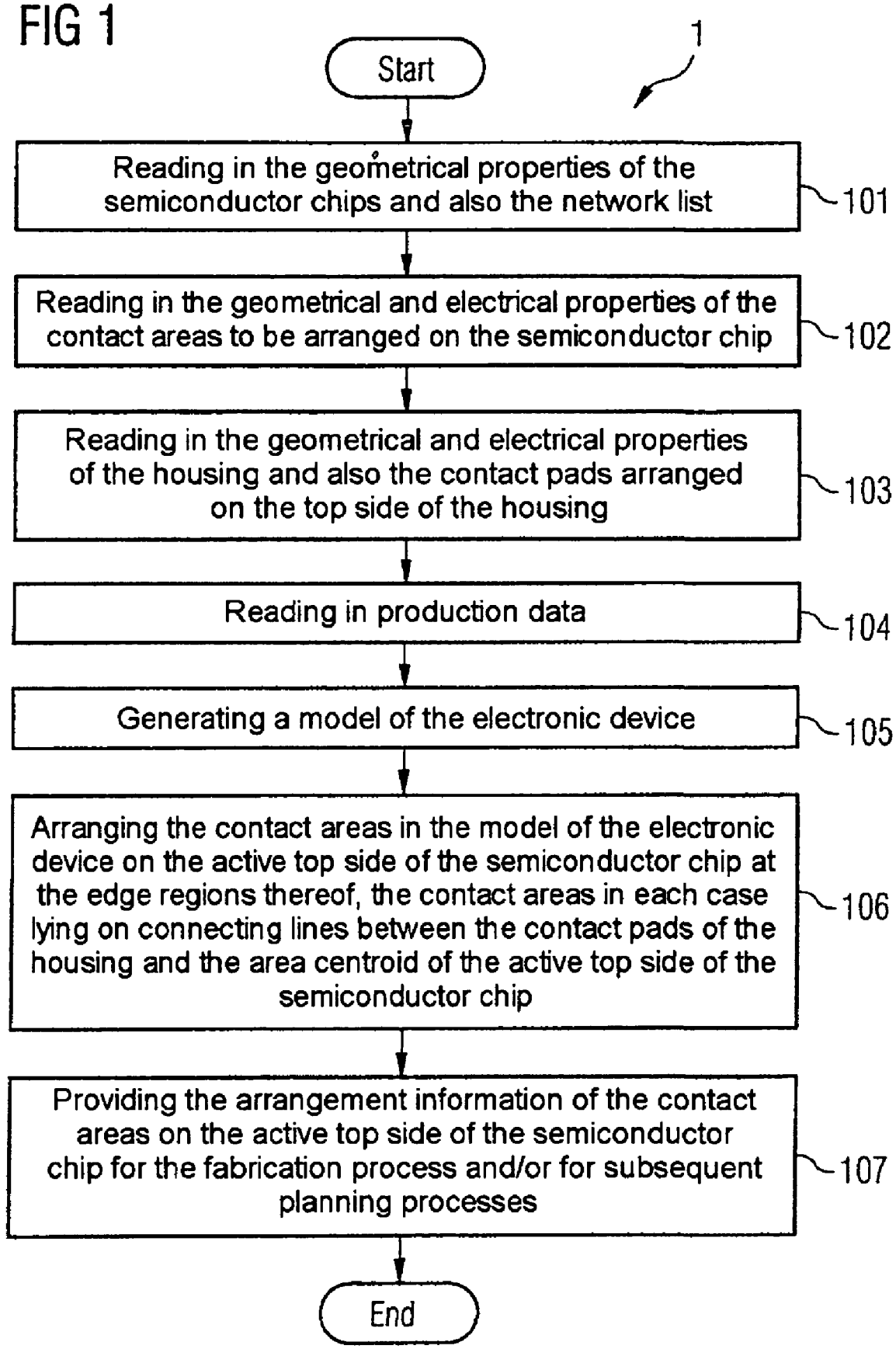
FIG. 1 illustrates a first flow diagram of a first embodiment of a method according to the invention for determining the arrangement of contact areas on the active top side of a semiconductor chip.

FIG. 1 illustrates a first flow diagram 1 of a first embodiment of a method according to the invention for determining the arrangement of contact areas on the active top side of a semiconductor chip.

Figure 2:
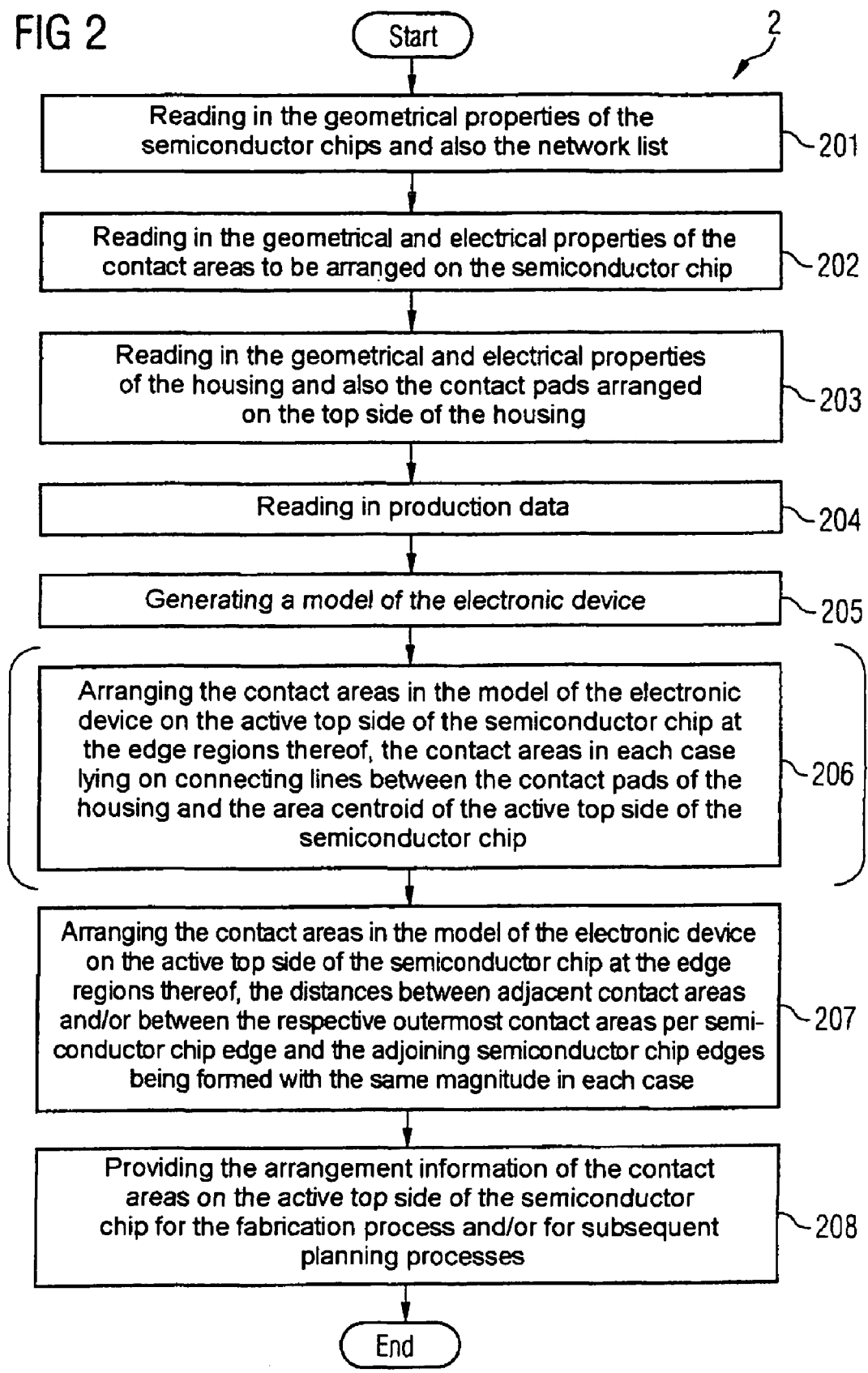
FIG. 2 illustrates a second flow diagram of a second embodiment of a method according to the invention.

FIG. 2 illustrates a second flow diagram 2 of a second embodiment of method according to the invention.

Figure 3:
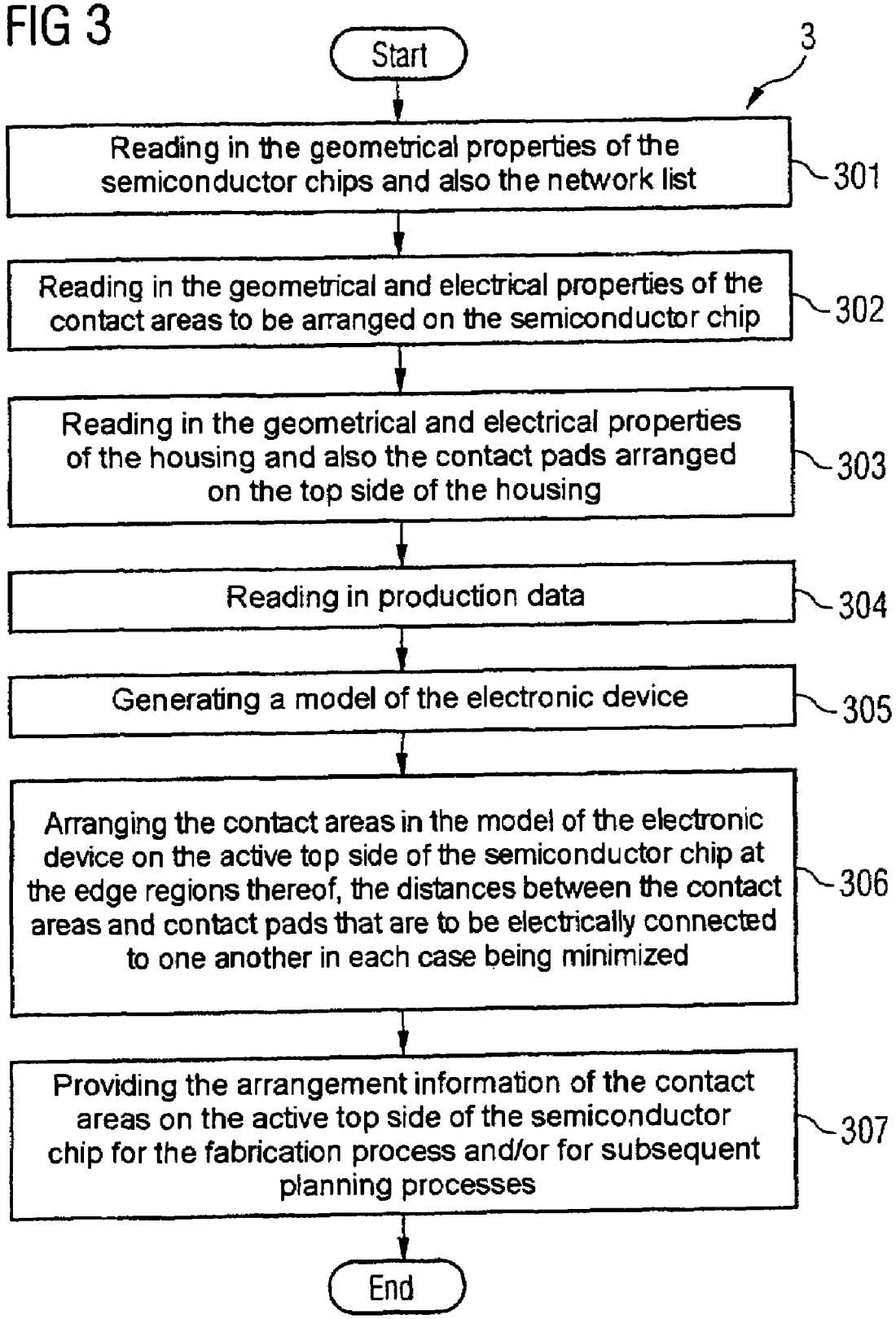
FIG. 3 illustrates a third flow diagram of a third embodiment of a method according to the invention.

FIG. 3 illustrates a third flow diagram 3 of a third embodiment of the method according to the invention.

The method and method variants represented in the flow diagrams 1 to 3 are performed on a computer system. The respective first five method processes and also the respective last method process of the method according to the invention for determining the arrangement of contact areas on a semiconductor chip in each case correspond for all three method variants and are accordingly explained together.

At the beginning of the method, a user selects a housing and also a semiconductor chip which is to be positioned on or in the housing. Descriptions of the semiconductor chip and also of the housing are stored in data form on the computer system, in particular as separate files.

At 101, 201, and respectively 301 according to the invention, the geometrical properties of the semiconductor chip that are stored in files and also the network list, which comprises information about the number of contact areas to be arranged at each edge of the semiconductor chip, are read into a main memory area of the computer system. At 102, 202 and respectively 302 according to the invention, the geometrical and electrical properties of the contact areas to be arranged on the semiconductor chip are read in. These data are likewise stored in files and contain information about the contact area type, for example signal pad or supply pad, about the dimensions of the contact areas and about the minimum distances to be complied with around the contact areas.

At 103, 203 and respectively 303 according to the invention, the geometrical and electrical properties of the housing and also of the contact pads arranged on the top side of the housing are read into the main memory area of the computer system. These data are likewise present in files. In this case, the precise position of the contact pads on the top side of the housing is predefined and a prerequisite of the method according to the invention as described in this exemplary embodiment.

At 104, 204 and respectively 304, production-specific data, which are likewise present in the form of files, are read into the main memory area of the computer system. These production-specific data are also referred to as "design rules" and define inter alia the arrangement of the semiconductor chip in relation to the housing. The structure of such "design rules" is familiar to the person skilled in the art and need not be explained in any greater detail here.

From the data that have been read in in the first four method processes, the computer system then generates a model of the electronic device which has a housing and also a semiconductor chip arranged in or on the housing. In this case, said model is formed as a graphic backed with geometrical and electrical data, is present on the main memory area of the computer system and is visualized on an output unit, in particular on a screen.

The subsequent method processes relate to the arrangement of the contact areas in the model of the electronic device on the active top side of the semiconductor chip at the edge regions thereof. This arrangement is performed differently in the three method variants.

In the case of the method variant represented in the first flow diagram 1, the sixth method 106 provides an almost or completely radial arrangement of the contact areas in each case on connecting lines between the contact pads of the housing and the area centroid of the active top side of the semiconductor chip.

In accordance with the method variant represented in the second flow diagram 2, the arrangement of the contact areas in the model of the electronic device can be effected in two different ways, namely firstly by progressively performing the sixth method 206 and the seventh method 207 and secondly by solely performing the seventh method 207 whilst omitting the sixth method 206.

In the case of the first embodiment procedure of the second variant, the contact areas are firstly arranged on connecting lines between the contact pads of the housing and the area centroid of the active top side of the semiconductor chip and then shifted to an in each case identical distance between the respectively adjacent contact areas. The identical distance may also be provided between the respective outermost contact areas per semiconductor chip edge and the respectively adjoining semiconductor chip edges. The prior performance of the sixth method 206 ensures that the contact areas are arranged at those semiconductor chip edges which in each case lie the nearest to the contact pads on the housing.

In the case of the second embodiment procedure of the second method variant, the contact areas are arranged directly in a uniformly distributed manner at the semiconductor chip edge.

In the case of the third method variant represented in the sixth method 306 of the third flow diagram 3, the contact areas are arranged in the model of the electronic device by minimizing the distances between the contact areas and contact pads that are to be electrically connected to one another in each case. In this case, it is attempted, if possible, to position the contact areas directly opposite the contact pads. If this is not possible, then it is attempted, taking account of the number of contact areas to be positioned on each chip edge, to choose the angle between the imaginary straight bonding connection between contact area and contact pad and also the relevant semiconductor chip edge to be as close as possible to a right angle.

The last method 107, 208, 307 according to the invention corresponds for all three method variants and comprises providing the arrangement information of the contact areas on the active top side of the semiconductor chip for the fabrication process and/or for subsequent planning processes.

Figure 4:
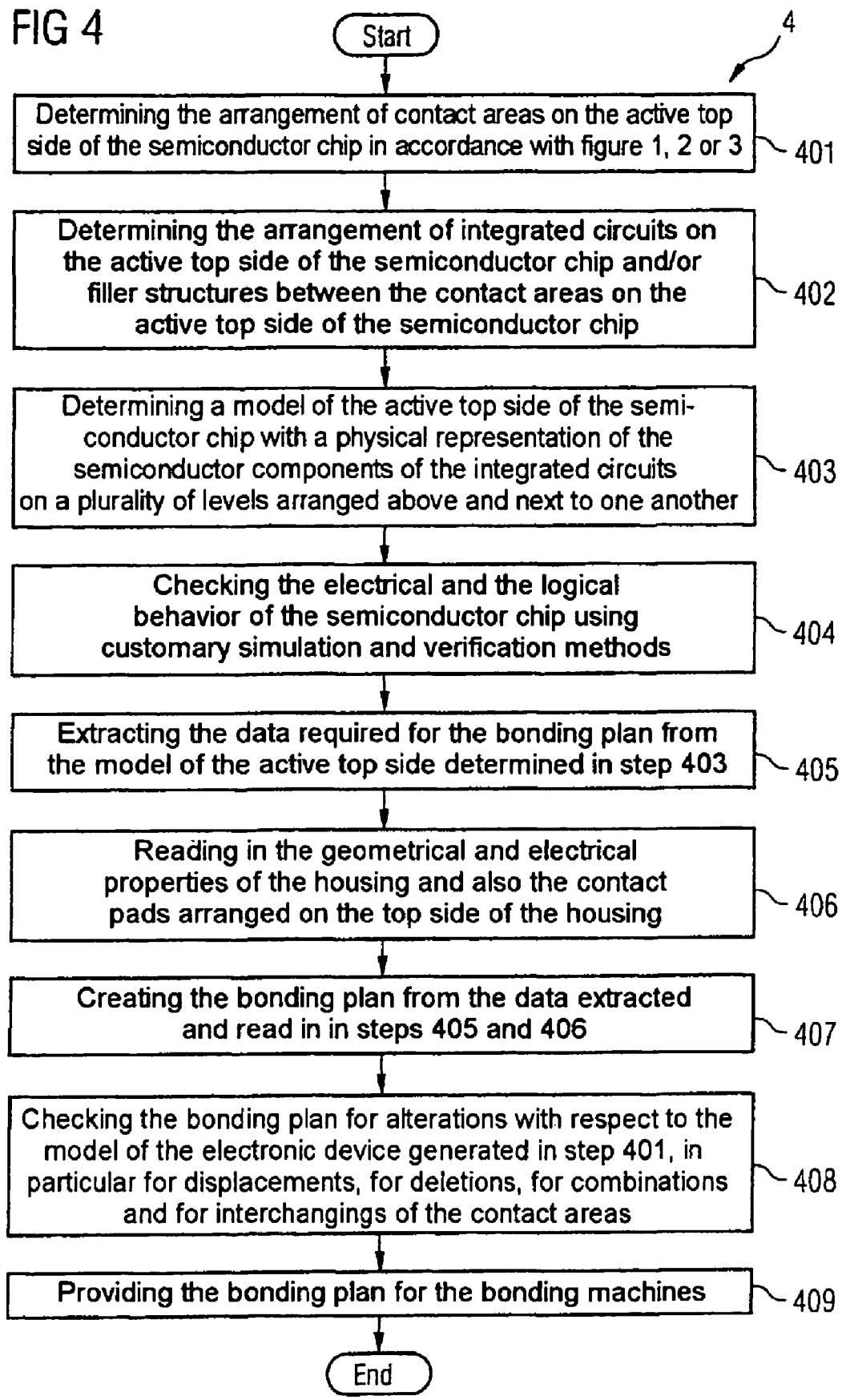
FIG. 4 illustrates a fourth flow diagram of a method according to the invention for creating a bonding plan for an electronic device having a semiconductor chip and having a housing.

FIG. 4 illustratres a fourth flow diagram 4 of the method according to the invention for creating a bonding plan for an electronic device having a semiconductor chip and having a housing.

Figure 5:
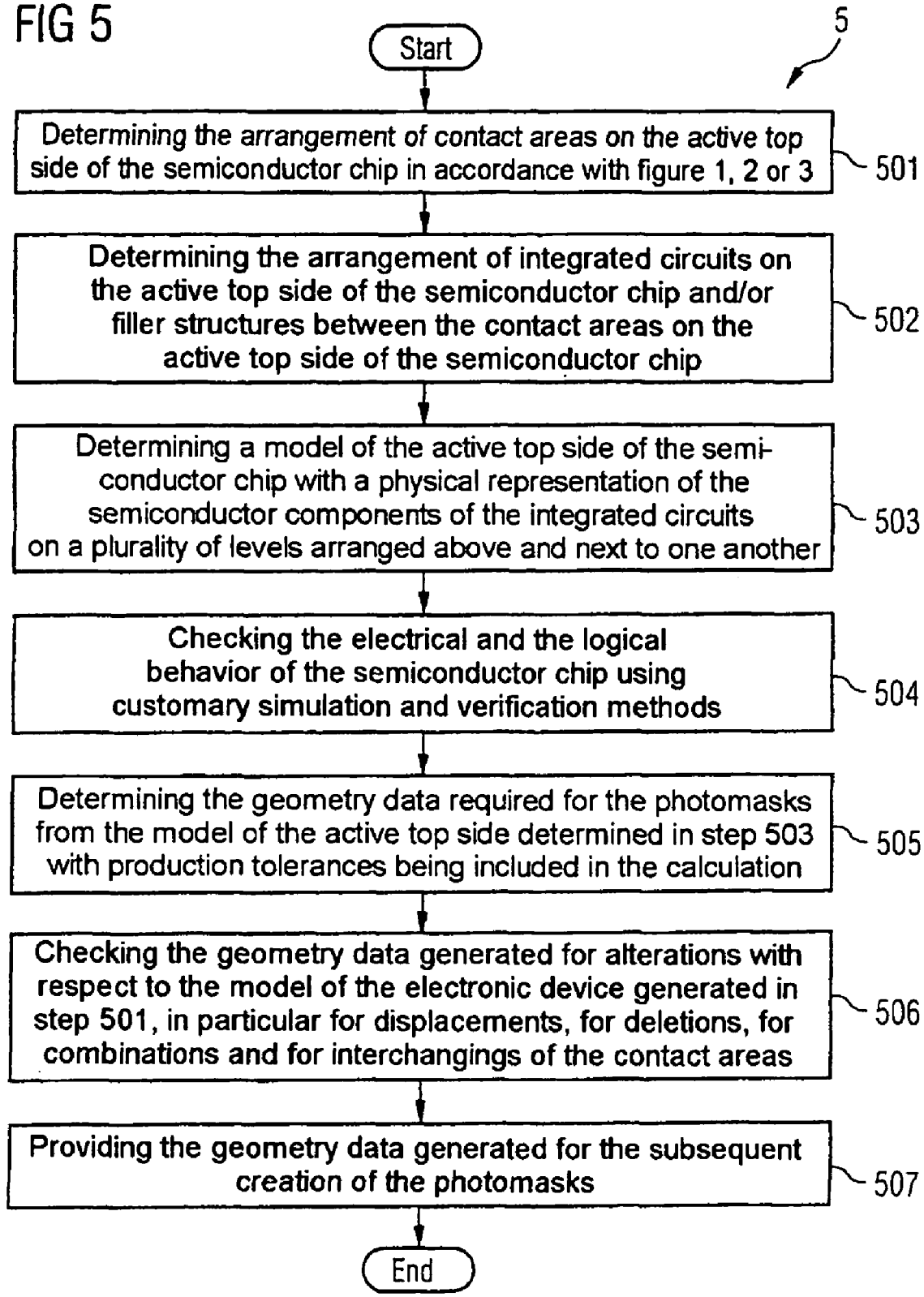
FIG. 5 illustrates a fifth flow diagram of a method according to the invention for generating geometry data for the creation of photomasks for the exposure of an electronic device having a semiconductor chip and having a housing by means of photolithographic methods.

FIG. 5 illustrates a fifth flow diagram 5 of the method according to the invention for generating geometry data for the creation of photomasks for the exposure of an electronic device having a semiconductor chip and having a housing by means of photolithographic methods.

The methods represented in the flow diagrams 4 and 5 have at the beginning the four respectively corresponding method steps 401 to 404 and 501 to 504, which are explained in summary below.

Both methods assume the prior performance of the method according to the invention for determining the arrangement of contact areas on the active top side of a semiconductor chip. The variants of this method have already been explained in FIGS. 1 to 3. The method steps 401 and 501, respectively, thus yield the arrangement information of the contact areas on the active side of the semiconductor chip in the form of geometrical data.

The second method 402 and respectively 502 provides for determining the arrangement of integrated circuits on the active top side of the semiconductor chip and/or of filler structures between the contact areas on the active top side of the semiconductor chip. In this case, the integrated circuits are considered as black boxes and arranged on the basis of their estimated dimensions on the active top side of the semiconductor chip using positioning algorithms known to the person skilled in the art. In the edge regions of the semiconductor chip, filler structures are provided between the contact areas in order to ensure the voltage supply or the electrical connection between the contact areas.

The third method 403 and respectively 503 provides for determining a model of the active top side of the semiconductor chip in the form of a physical representation of the integrated circuits on a plurality of levels arranged above and next to one another. In this case, the integrated circuits are no longer considered as black boxes, but rather in terms of their microscopically small physical structure with semiconductor devices, e.g. transistors, resistances, inductances and capacitances. These are already wired to one another in the model of the active top side of the semiconductor chip. The model of the active top side of the semiconductor chip also comprises the contact areas.

The subsequent fourth method 404 and respectively 504 involves checking the electrical or the logical behavior of the determined model of the semiconductor chip using customary simulation and verification methods familiar to the person skilled in the art. If errors are detected at this juncture, then the respective method terminates.

The text below will firstly explain the further method steps of the method for creating a bonding plan as shown in FIG. 4.

In the fifth method 405, the data required for the bonding plan are extracted from the model of the active top side of the semiconductor chip that was determined in 403. This concerns data regarding the arrangement and the properties of the contact areas and data regarding the geometry and arrangement of the semiconductor chip. In the next method 406, the geometrical and electrical properties of the housing and also of the contact pads arranged on the surface of the housing are read into the main memory area of the computer system. This may either concern the data read in in 103 and 203 and 303, respectively, in FIGS. 1 to 3. It is furthermore possible for these data to have been processed further, for example by housing creation, by simulation, by contact artwork creation and/or by storage in a standard format, for example GDSII.

A bonding plan is then created from the data extracted in step 405 and also from the data read in in 406. Said bonding plan is a graphical representation backed with geometrical data referred to a fixed zero point on the computer system or on an output unit, in particular on a screen or a printer of the computer system. In the subsequent eighth method 408, this bonding plan is examined for alterations with respect to that model of the electronic device which was created in step 401 or in method 105, 205 and respectively 305 of the flow diagrams 1, 2 and 3. This check concentrates in particular on deletions, on combinations and also on interchangings of contact areas. If serious discrepancies are ascertained, then an error message is output on the screen of the computer system. The method may be terminated at this juncture in this case. If this checking step does not yield any errors or discrepancies, then the bonding plan is provided for the bonding machines in the last method 409.

The text below will explain the further method steps of the method for generating geometry data for the creation of photomasks as shown in FIG. 5, starting from the fifth method 505.

In this fifth method 505, the geometry data required for the photomasks are determined from the model of the active top side of the semiconductor chip. Production tolerances are included in the calculation in this case. The information encompassed by such geometry data required for the photomasks is known to the person skilled in the art and need not be explained any further here.

In the sixth method 506, the geometry data generated are checked for alterations with respect to the model of the electronic device generated in 501 or in method 105, 205 and respectively 305 of the flow diagrams 1, 2 and 3. This check is effected in particular for displacements, for deletions, for combinations and for interchangings of the contact areas. If alterations are ascertained, then an error message is output on the screen of the computer system. The method according to the invention may be terminated at this juncture. In the last method step, the geometry data generated are provided for the subsequent creation of the photomasks. The photomasks for the exposure of the surface of the semiconductor chip can be created directly on the basis of said geometry data.

Figure 6:
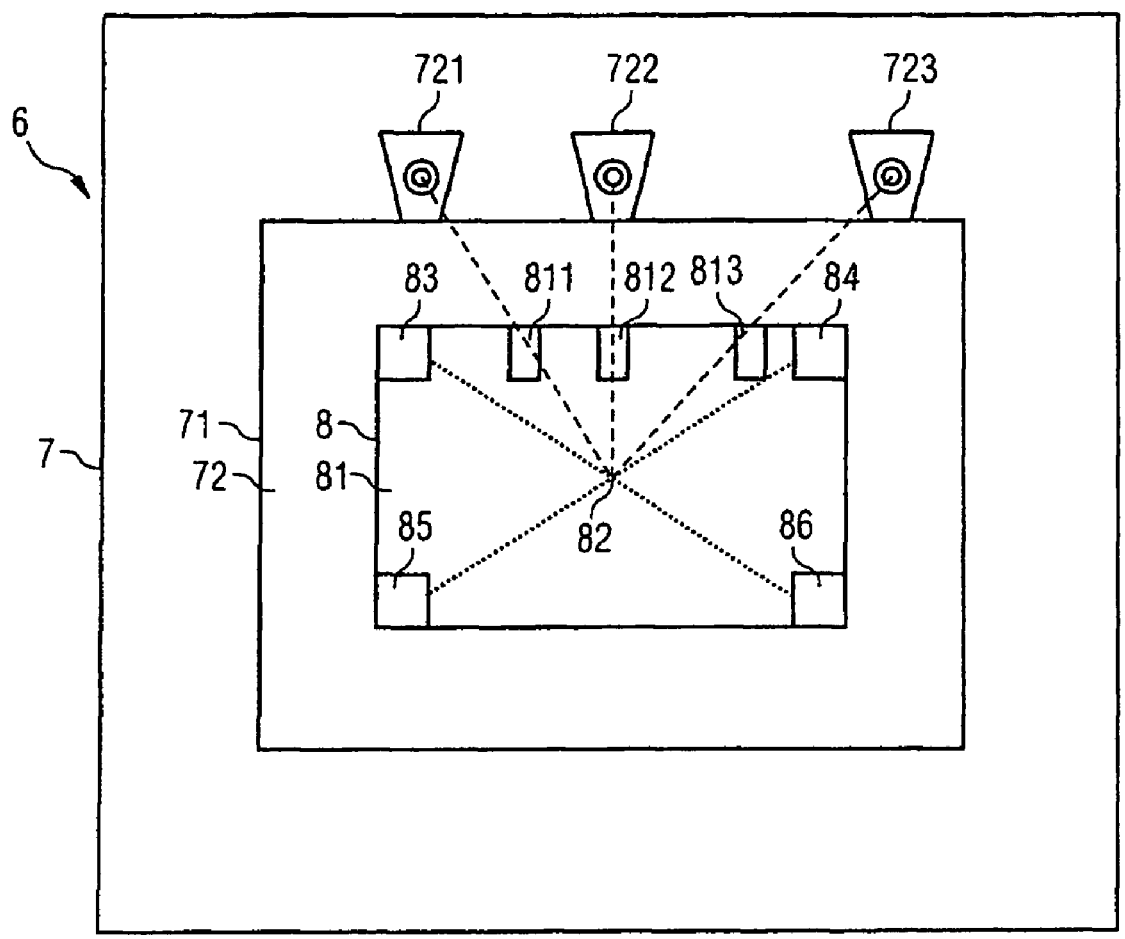
FIG. 6 illustrates a schematic plan view of one embodiment of a first electronic device according to the invention.

FIG. 6 illustrates a schematic plan view of a first electronic device 6.

Hereinafter the terms "top" and "bottom" are used in each case referring to the direction of the y axis of the system of coordinates illustrated in FIG. 6, and the terms "right" and "left" are in each case used referring to the direction of the x axis of the system of coordinates. This applies mutatis mutandis to FIGS. 6 to 10.

FIG. 6 reveals an elongate rectangular housing 7 having a likewise elongate rectangular centered area 72 surrounded by a line 71. A first contact pad 721, a second contact pad 722 and a third contact pad 723 are arranged next to one another at the top side of said line 71. Said contact pads in each case have a trapezoidal form and adjoin the top side of the line 71 with their narrow side. A solder ball is in each case represented centrally in the contact pads 721 to 723. The second contact pad 722 is arranged in centered fashion with regard to the top side of the inner edge. The first contact pad 721 is situated approximately centrally between the left-hand end of the top side of the line 71 and the second contact pad 722. The third contact pad 723 is situated near the right-hand end of the top side of the line 71.

A likewise elongate rectangular first semiconductor chip 8 is provided within the area 72 and is fixed with its passive rear side (not shown) centrally on the area 72. Accordingly, its active top side 81 can be seen in FIG. 6, this top side being situated approximately at the same height as the front side of the housing 7. Gray-underlaid square corner regions 83, 84, 85 and 86 are respectively arranged at the four corners of the first semiconductor chip 8. Moreover, FIG. 6 illustrates the diagonals of the active top side 81 with dotted auxiliary lines. The point of intersection between the two diagonals represents the area centroid 82 of the active top side 81. Straight connecting lines represented in dashed fashion in FIG. 6 run between the contact pads 721 to 723 and the area centroid 82. Contact areas 811 to 813 are positioned at the upper edge of the active top side 81. In this case, the first contact area 811 is situated on the connecting line between the area centroid 82 and the first contact pad 721, the second contact area 812 lies on the connecting line between the area centroid 82 and the second contact pad 722, and the third contact area 813 is arranged on the connecting line between the area centroid 82 and the third contact pad 723.

The text below will explain the method according to the invention for determining the arrangement of contact areas in accordance with the first flow diagram 1 on the basis of the first electronic device 6. A user initially defines that the first semiconductor chip 8 is to be positioned on the area 72 of the housing 7. This is done by the user selecting the housing 7 and also the first semiconductor chip 8, the geometrical and electrical properties of which are stored in the form of data on the computer system, on a customary computer system (not shown here).

This is followed by reading in the geometrical properties of the first semiconductor chip 8, namely the length thereof and the width thereof, and also the dimensions of the corner regions 83 to 86, and also the network list, which provides the number and also the order of the three contact areas 811 to 813. The geometrical and electrical properties of the three contact areas 811 to 813 are then read in from a separate database. Furthermore, the geometrical and electrical properties of the housing 7 and also of the contact pads 721 to 723 are read in. Finally, the production data defining the arrangement of the first semiconductor chip 8 in the housing 7 are read in.

From these data that have been read in, the computer system generates a model of the electronic device which corresponds to the representation in FIG. 6, in which case the precise arrangement of the contact areas 811 to 813 has not yet been defined. This precise arrangement is then determined in the next method step. In this case, respective straight auxiliary lines are drawn from the contact pads 721 to 723 to the area centroid 82. The contact areas 811 to 813 are then positioned at the top edge of the first semiconductor chip 8 such that the center of the top side of the contact areas 811 to 813 respectively lie at the points of intersection between the connecting lines and the top edge of the active top side 81 of the first semiconductor chip 8. This arrangement of the contact areas 811 to 813 is stored in the form of geometrical data. These data can be utilized for the subsequent fabrication process and/or for subsequent planning and design processes.

Figure 7:
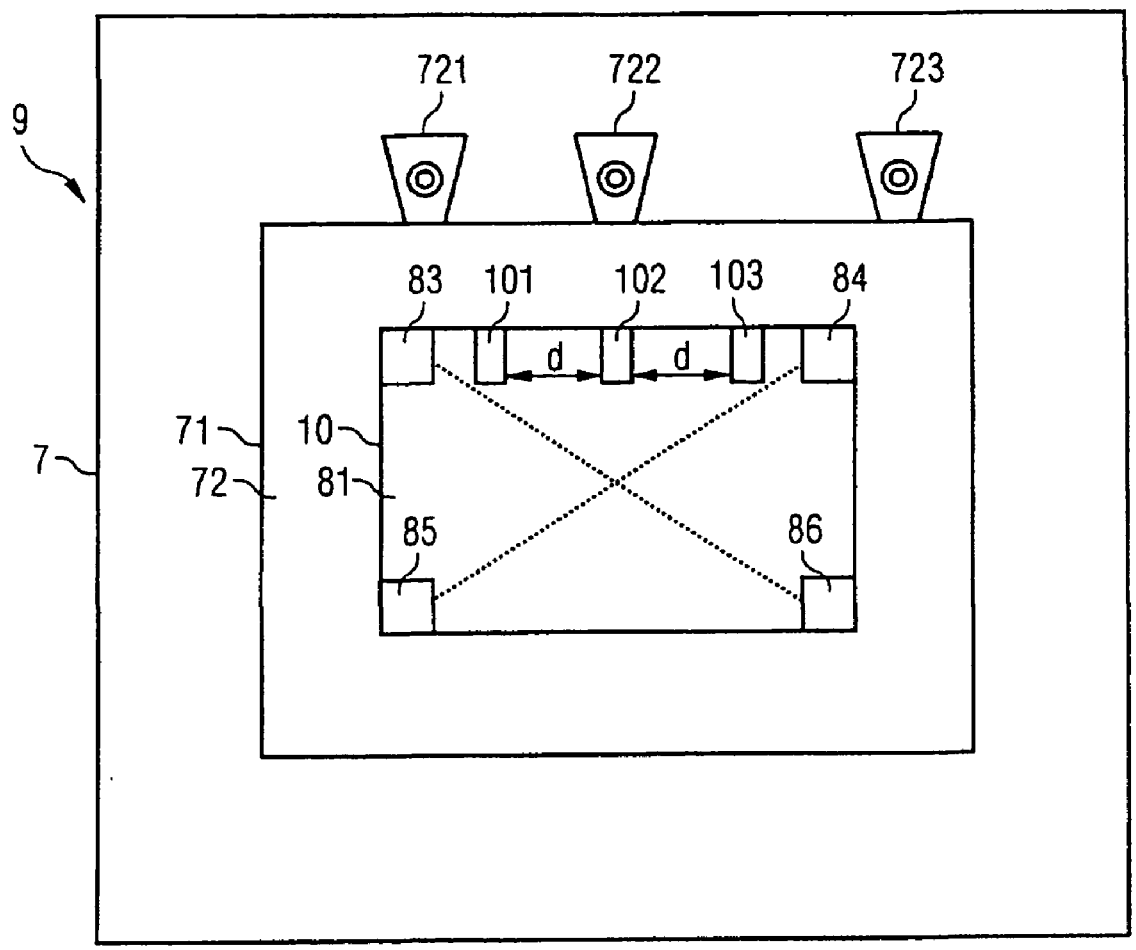
FIG. 7 illustrates a schematic plan view of one embodiment of a second electronic device according to the invention.

FIG. 7 illustrates a schematic plan view of a second electronic device 9.

This second electronic device 9 is subdivided into the housing 7 already described and into a second semiconductor chip that is applied with its passive rear side within the area 72. In this case, the second semiconductor chip 10 corresponds to the first semiconductor chip 8 with regard to its arrangement in relation to the housing 7, with regard to its dimensions and with regard to the corner regions 83 to 86.

A fourth contact area 101, a fifth contact area 102 and also a sixth contact area 103 are situated at the top edge of the active top side 81 of the second semiconductor chip 10. In this case, the fifth contact area 102 is arranged centrally with regard to the top edge of the active top side 81 of the second semiconductor chip 10. The fourth contact area 101 is situated to the left of the fifth contact area 102 and the sixth contact area 103 is situated to the right of the fifth contact area 102. In this case, a distance d of identical magnitude is in each case provided between the fourth contact area 101 and the fifth contact area 102 and also between the fifth contact area 102 and the sixth contact area 103.

The text below explains the method according to the invention for determining the arrangement of contact areas in accordance with the second flow diagram 2 on the basis of the second electronic device 9.

In this case, 201 to 205 correspond to the method 101 to 105 described in the explanation of FIG. 6 and will not be dealt with again.

In the performance of the method according to the invention in accordance with FIG. 2, the method 206 may be performed, which corresponds to the method 106 already explained in FIG. 6 and is therefore not explained again. In this case, in FIG. 7, said method 206 may serve as a preparatory step for the seventh method 207.

In the seventh method 207, the contact areas 101 to 103 are arranged in a uniformly distributed manner at the top edge of the active top side of the second semiconductor chip 10. In this case, a distance d of identical magnitude is in each case complied with between the adjacent contact areas 101 and 102, and respectively 102 and 103. Said distance d may be predefined in a user-defined manner or be determined from the number of contact areas per side edge and from the width of the side edge. In an exemplary embodiment that is not shown here, said method 207 may also be provided such that the distance d is also provided between the respective outermost contact areas per side edge and the adjoining side edges of the semiconductor chip and/or the edge regions that are to be kept free. The arrangement information of the contact areas 101 to 103 on the active top side 81 of the second semiconductor chip 10 may be provided to subsequent fabrication or planning processes.

Figure 8:
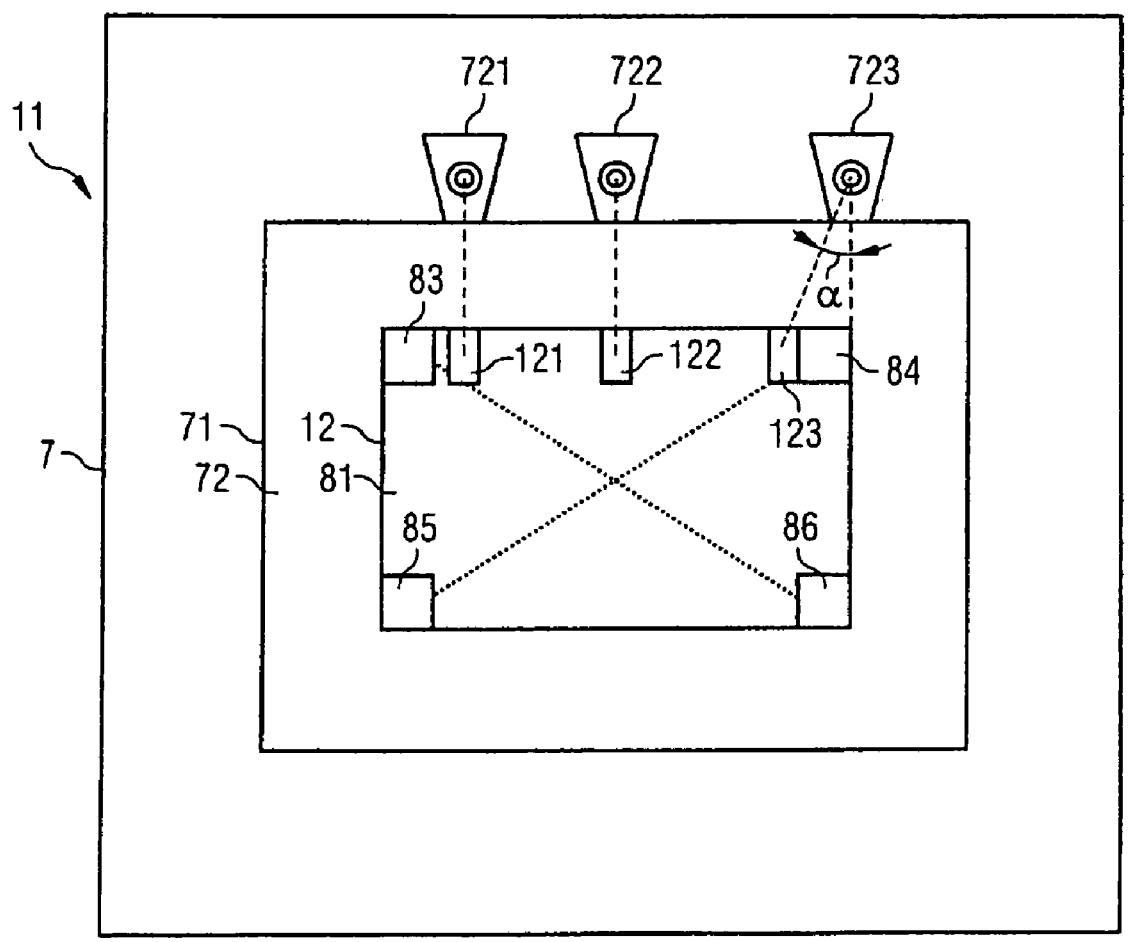
FIG. 8 illustrates a schematic plan view of one embodiment of a third electronic device according to the invention.

FIG. 8 illustrates a schematic plan view of a third electronic device 11.

The third electronic device 11 is subdivided into the housing 7 already described and into a third semiconductor chip 12 mounted onto the area 72 by its passive rear side. In this case, the third semiconductor chip 12 corresponds to the first semiconductor chip 8 described in FIG. 6 with regard to its dimensioning, with regard to its orientation with respect to the housing 7 and with regard to its corner regions 83 to 86.

The contact areas 121 to 123 are arranged at the top side edge of the active top side 81 of the third semiconductor chip 12. In this case, the seventh contact area 121 lies perpendicularly below the first contact pad 721. The eighth contact area 122 is situated perpendicularly below the second contact pad 722. The ninth contact area 123 adjoins the corner region 84 on the left. The bonding connections between the contact areas 121 to 123 and the contact pads 721 to 723 are indicated by dashed lines in FIG. 8. The bonding connections between the contact areas 121, 122 and the contact pads 721, 722 run perpendicularly in each case. The bonding connections between the ninth contact area 123 and the third contact pad 723 run at an angle α with respect to an imaginary perpendicular connection between the third contact pad 723 and the top side edge of the active top side 81 of the third semiconductor chip 12.

The text below explains the method according to the invention for determining the arrangement of contact areas in accordance with FIG. 3 on the basis of the third electronic device 11 represented in FIG. 8.

The first five method steps 301 to 305 correspond to the method steps 101 to 105 described with reference to FIG. 6 and are not explained separately. The sixth method step 306 provides for the wire-length-optimized arrangement of the contact areas 121 to 123 in the model of the third electronic device 11 on the active top side 81 of the third semiconductor chip 12 at the edge regions thereof. In this case, the seventh contact area 121 and the eighth contact area 122 may be arranged directly below the first contact pad 721 and the second contact pad 722, respectively, as a result of which a shortest possible perpendicular bonding connection can be provided. The ninth contact area 123 cannot be arranged directly below the third contact pad 723. This is because a corner region 84 that is to be kept free is provided in the case of the third semiconductor chip 12 and no contact areas whatsoever are permitted to be arranged in said corner region. Accordingly, the ninth contact area 123 is positioned at the top edge of the active top side 81 of the third semiconductor chip 12 directly next to the corner region 84 such that the angle α of its straight bonding connection with respect to the third contact pad 723 is minimal in relation to the perpendicular arrangement.

The arrangement of the contact areas 121 to 123 which is determined in this way is then stored in the form of geometrical data which can be used for further fabrication and/or planning processes.

Figure 9:
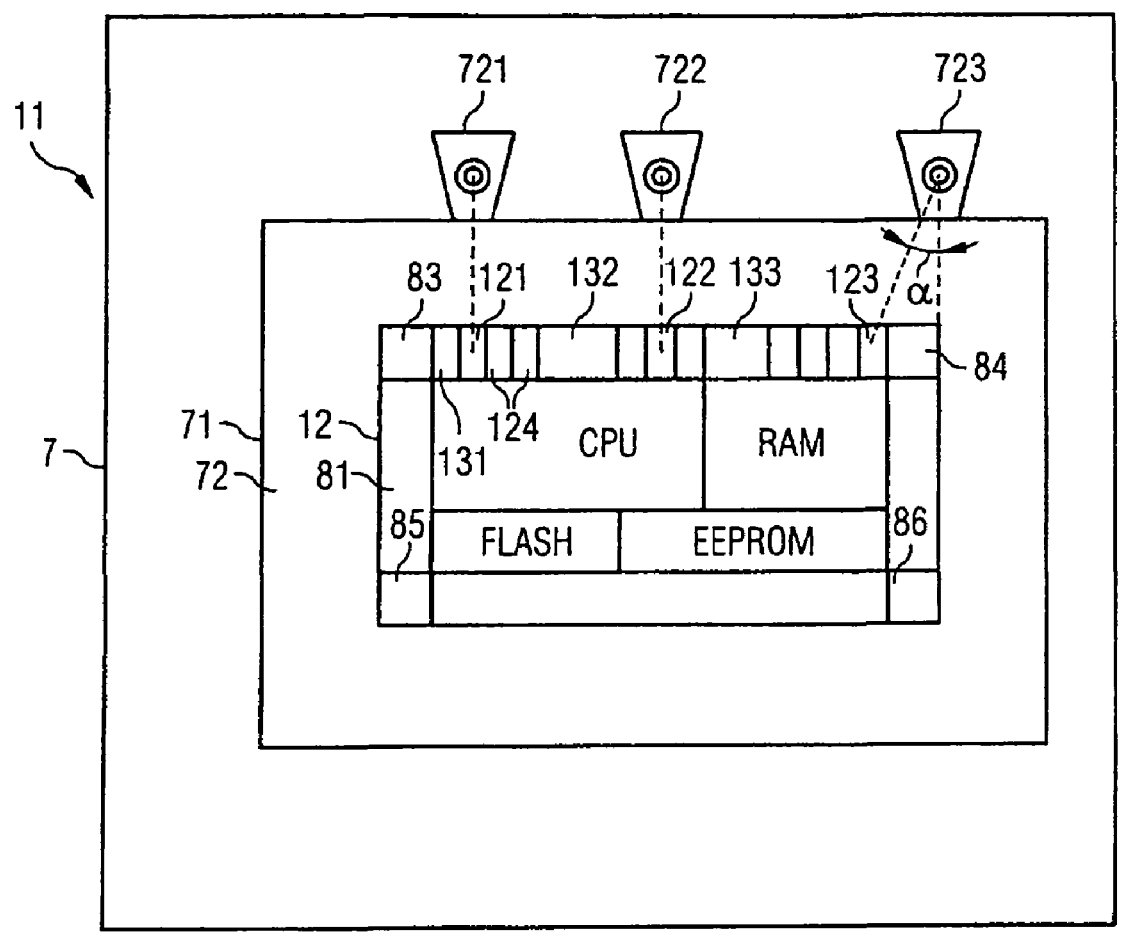
FIG. 9 illustrates a schematic plan view of one embodiment of a third electronic device according to the invention with a third semiconductor chip that has already been coarsely patterned.

FIG. 9 illustrates a schematic plan view of a third electronic device 11 comprising the coarsely patterned third semiconductor chip 12.

In this case, the housing 7 and the dimensions, the arrangement, the corner regions 83-86 and the contact areas 121-123 of the third semiconductor chip 12 correspond to the representation shown in FIG. 8.

Two further contact areas 124 are provided in a manner adjoining the seventh contact area 121 on the right. Two further contact areas 124 are likewise situated such that they adjoin the eighth contact area 122 respectively on the left and on the right. Three further contact areas 124 are arranged next to the ninth contact area 123 on the left. The contact areas 121-124 have the same form in each case.

A first filler structure 131 is positioned between the corner region 83 and the seventh contact area 121. A second filler structure 132 and also a third filler structure 133 are arranged between the contact area blocks in which the seventh contact area 121, the eighth contact area 122 and the ninth contact area 123 are situated. These filler structures 131 to 133 ensure the voltage supply of the contact areas 121 to 124.

Positioned in the central region of the active top side 81 of the third semiconductor chip 12 are integrated circuits, namely a first integrated circuit CPU, a second integrated circuit RAM, a third integrated circuit FLASH and a fourth integrated circuit EEPROM. In this case, the first integrated circuit CPU is situated in a top left region, the second integrated circuit RAM is situated in a top right region, the third integrated circuit FLASH is situated in a bottom left region and the fourth integrated circuit EEPROM is situated in a bottom right region of the active top side 81 of the third semiconductor chip 12.

Figure 10:
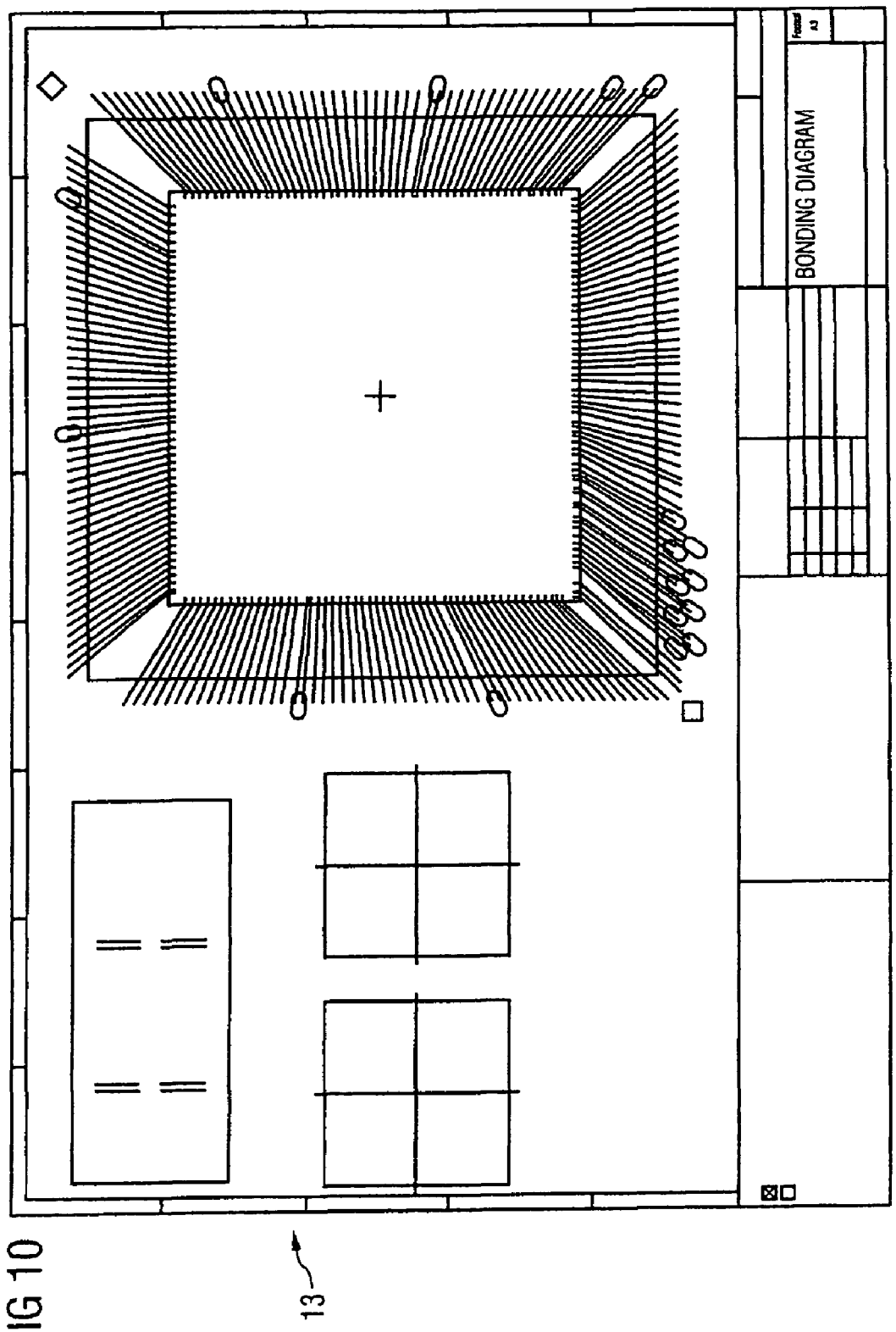
FIG. 10 illustrates a schematic representation of a bonding plan according to one embodiment of the invention.

FIG. 10 illustrates a schematic representation of a bonding plan 13.

The bonding plan 13 shows a semiconductor chip and also a housing in which the semiconductor chip is arranged. A multiplicity of bonding connections run between contact areas on the semiconductor chip and contact pads on the housing.

This bonding plan 13 serves to demonstrate the complexity of such a bonding plan. Regions in which data, in particular geometrical and electrical data, can be represented are provided on the left next to the bonding plan and also in a foot region under the bonding plan. The bonding plan 13 can be represented on the screen of a computer system.

The text below will explain the method according to the invention for creating a bonding plan in accordance with FIG. 4 for the third electronic device 11 with reference to FIGS. 8-10.

In this case, the method for determining the arrangement of contact areas as illustrated in the third flow diagram 3 forms the first method 401 according to the invention. The second method 402 has recourse to the arrangement information of the contact areas 121-123 that is determined in this way. In this case, it is assumed at this juncture that the arrangement information of the contact areas 124 also emerges from the already performed method for determining the arrangement of contact areas.

The second method 402 then involves determining the arrangement—shown in FIG. 9—of the integrated circuits CPU, RAM, FLASH and EEPROM on the active top side 81 of the third semiconductor chip 12. Furthermore, the filler structures 131 to 133 are also positioned on the active top side of the semiconductor chip between the contact areas 121 to 124—as is readily discernible in FIG. 9. The positioning methods used in this case are known to the person skilled in the art and need not be explained in any greater detail here.

The next method step 403 according to the invention involves determining a model of the active top side 81 of the third semiconductor chip 12 with a physical representation of the semiconductor components. Said model comprises a plurality of levels or material layers arranged above and next to one another. The structure of such a model, which can be represented only with very great difficulty on account of its complexity, is known to the person skilled in the art. Therefore, a representation of such a model can be omitted at this juncture.

At 404, the model of the third semiconductor chip 12 determined in this way is determined using customary simulation and verification methods that are likewise known to the person skilled in the art.

At 405, the data required for the bonding plan are extracted from the model of the active top side 81 of the third semiconductor chip 12 that was determined in method step 403. These data required for the bonding plan comprise the geometrical properties of the third semiconductor chip 12, and also the arrangement of the third semiconductor chip 12 in relation to the housing 7, and furthermore the geometrical and electrical properties and also the precise arrangement of the contact areas 121 to 124.

Process 406 involves reading in the geometrical and electrical properties of the housing 7 and also of the contact pads 721 to 723 arranged on the top side of the housing 7. In this case, this method step has recourse to the housing properties read in in method 401 or in methods 103, 203 and 303. These geometrical and electrical properties of the housing may also emerge from a separate housing development process which builds on the method for determining the arrangement of contact areas as shown in FIG. 3 and from this designs a housing, simulates the latter, from this creates contact artwork and stores the latter in a standard graphical format.

A bonding plan is then created from the extracted semiconductor chip data and from the housing data that have been read in. The representation in FIG. 8 in which the bonding connections between the contact areas 121 to 123 and the contact pads 721 to 723 are represented in solid fashion rather than in dashed fashion corresponds to such a bonding plan, which is greatly simplified with respect to real electrical devices. The representation of the realistic bonding plan 13 in FIG. 10 gives a picture of the complexity of the electronic devices to which the method according to the invention can be applied.

In 408, the bonding plan generated is examined for alterations with respect to the model of the electronic device generated at the beginning of the method, in particular for displacements, for deletions, for combinations and for interchangings of the contact areas 121-124. In the present exemplary embodiment, the model of the third electronic device 11 corresponds to the bonding plan created. No discrepancies or errors whatsoever are ascertained. In the last method step 409 according to the invention, the bonding plan created in this way is stored or forwarded to the bonding machines for production.

The text below explains the method according to the invention for generating geometry data in accordance with the fifth flow diagram in FIG. 5 on the basis of the third electronic device 11 with reference to FIGS. 8 and 9.

Up to the method 504 of checking the electrical and logical behavior of the semiconductor chip using customary simulation and verification methods, the method for generating geometry data in this case corresponds to the method for creating a bonding plan just described. Accordingly, the method steps 501 to 504 will not be explained again.

The geometry data required for the photomasks are then determined from the model of the active top side 81 of the third semiconductor chip 12 that was determined in method 503. Production tolerances are included in the calculation in this case. The volume of said geometry data is up to a few hundred gigabytes and can scarcely be represented graphically. These geometry data are used to determine the construction of a plurality or all of the photomasks of a set of masks required for the production of a semiconductor chip. The construction of such photomasks and also the geometry data required for such photomasks are familiar to the person skilled in the art and are not explained in any greater detail at this juncture.

The geometry data generated in this way are examined for alterations with respect to the model of the third electronic device 12 generated in method 501 or in method 305 of the previously performed method. No displacements, deletions, combinations or interchangings of the contact areas 121-124 whatsoever are ascertained in the present exemplary embodiment. Therefore, the geometry data generated are made available to the subsequent processes for manually creating the photomasks.

The invention claimed is:

1. A method for determining the arrangement of contact areas on an active top side of a semiconductor chip arranged in or on a housing, the method being performed on a computer system, comprising:
    reading semiconductor chip data into the computer system, the semiconductor chip data comprising geometrical properties of the semiconductor chip and information about a number of contact areas to be arranged at each edge of the semiconductor chip;
    reading contact area data into the computer system, the contact area data comprising geometrical and electrical properties of contact areas to be arranged on the active top side of the semiconductor chip;
    reading housing data into the computer system, the housing data comprising geometrical and electrical properties of the housing and also of contact pads arranged on a top side of the housing;
    reading production data into the computer system, the production data defining the arrangement of the semiconductor chip in relation to the housing;
    generating a model of an electronic device, which comprises the housing and the semiconductor chip arranged with its passive rear side on the top side of the housing, from the semiconductor chip data, contact area data, housing data and production data;
    arranging the contact areas in the model of the electronic device in edge regions on the active top side of the semiconductor chip
    wherein in the case of contact areas arranged at a respective semiconductor chip edge, distances of identical magnitude in each case are provided between adjacent contact areas and/or between the respective outermost contact areas per semiconductor chip edge and the adjoining semiconductor chip edges; and
    providing the contact area arrangement data for subsequent fabrication and/or design processes of the semiconductor chip and/or of the housing and/or of the electronic device.

2. The method of claim 1, comprising arranging the contact areas in such a way that the contact areas in each case lie on straight connecting lines between the contact pads within the housing and the area centroid of the active top side of the semiconductor chip.

3. The method of claim 1, comprising wherein the contact areas are firstly in each case arranged on connecting lines between the contact pads on the top side of the housing and the area centroid of the active top side of the semiconductor chip.

4. The method of claim 1, comprising wherein the contact areas arranged at an identical semiconductor chip edge are subsequently displaced such that the distances between adjacent contact areas and/or between the respective outermost contact areas per semiconductor chip edge and the adjoining semiconductor chip edges are formed with the same magnitude in each case.

5. The method of claim 1, comprising wherein the distances between the contact areas and contact pads that are to be electrically connected to one another in each case are minimized.

* * * * *

UNITED STATES PATENT AND TRADEMARK OFFICE
CERTIFICATE OF CORRECTION

| | | |
|---|---|---|
| PATENT NO. | : 7,370,303 B2 | Page 1 of 1 |
| APPLICATION NO. | : 10/528035 | |
| DATED | : May 6, 2008 | |
| INVENTOR(S) | : Juergen Einspenner et al. | |

It is certified that error appears in the above-identified patent and that said Letters Patent is hereby corrected as shown below:

Column 1, line 6, insert the following new paragraph:

Cross Reference to Related Applications

This Utility Patent Application claims the benefit of the filing date of German Application No. DE 102 45 452.3, filed September 27, 2002, and International Application No. PCT/DE03/03208, filed September 26, 2003, both of which are herein incorporated by reference.

Signed and Sealed this

Ninth Day of September, 2008

JON W. DUDAS
*Director of the United States Patent and Trademark Office*